(12) United States Patent
Shi (10) Patent No.: US 10,937,745 B2
(45) Date of Patent: Mar. 2, 2021

(54) SEMICONDUCTOR CHIP PACKAGE ARRAY (71) Applicant: TONGFU MICROELECTRONICS CO., LTD., Nantong (CN)

(72) Inventor: Lei Shi, Nantong (CN)

(73) Assignee: TONGFU MICROELECTRONICS CO., LTD., Nantong (CN)

( * ) Notice: Subject to any disclaimer, the term of this patent is extended or adjusted under 35 U.S.C. 154(b) by 0 days.

(21) Appl. No.: 16/440,773

(22) Filed: Jun. 13, 2019

(65) Prior Publication Data
US 2019/0385955 A1 Dec. 19, 2019

(30) Foreign Application Priority Data
Jun. 13, 2018 (CN) .......................... 201810608530.2

(51) Int. Cl.
*H01L 23/495* (2006.01)
*H01L 23/00* (2006.01)
(Continued)

(52) U.S. Cl.
CPC ........ *H01L 23/562* (2013.01); *H01L 21/4825* (2013.01); *H01L 21/4828* (2013.01); *H01L 21/561* (2013.01); *H01L 21/565* (2013.01); *H01L 21/78* (2013.01); *H01L 23/3107* (2013.01); *H01L 23/4952* (2013.01); *H01L 23/49503* (2013.01); *H01L 23/49513* (2013.01); *H01L 23/49548* (2013.01); *H01L 23/49575* (2013.01); *H01L 23/49582* (2013.01);
(Continued)

(58) Field of Classification Search
CPC . H01L 21/4828; H01L 21/4832; H01L 21/56; H01L 21/561; H01L 21/565; H01L 23/49534; H01L 23/49548; H01L 23/49575; H01L 23/49562; H01L 23/49582; H01L 21/566; H01L 23/49503; H01L 23/4951; H01L 23/49513; H01L 23/4952; H01L 23/49541; H01L 23/49565; H01L 21/4842; H01L 23/3107–315

See application file for complete search history.

(56) References Cited

U.S. PATENT DOCUMENTS

5,847,458 A * 12/1998 Nakamura .......... H01L 21/4828
257/738
10,008,437 B2 * 6/2018 Hayashi .............. H01L 23/4952
(Continued)

*Primary Examiner* — Yu Chen
(74) *Attorney, Agent, or Firm* — Anova Law Group, PLLC (57) ABSTRACT

Semiconductor chip package array is provided. The semiconductor chip package array includes: a lead frame, chips, an encapsulating layer, and an electroplating layer. The lead frame includes a first surface, a second surface, a plurality of support units arranged in a matrix, first grooves, second grooves, and third grooves. The first grooves are connected to the second grooves to form through holes and the third grooves are connected to adjacent support units of the plurality of support units. The chips are disposed on and electrically connected to the plurality of support units. An encapsulating material encapsulates the chips and at least a portion of the plurality of support units, and fill the first grooves to form the encapsulating layer. The electroplating layer is disposed on the second surface of the lead frame, and extends into the third grooves or into the third grooves and the second grooves.

7 Claims, 8 Drawing Sheets

(51) Int. Cl.
*H01L 21/48* (2006.01)
*H01L 21/56* (2006.01)
*H01L 21/78* (2006.01)
*H01L 23/31* (2006.01)

(52) U.S. Cl.
CPC ............ *H01L 24/16* (2013.01); *H01L 24/32* (2013.01); *H01L 24/48* (2013.01); *H01L 2224/16245* (2013.01); *H01L 2224/32245* (2013.01); *H01L 2224/48175* (2013.01)

(56) References Cited

U.S. PATENT DOCUMENTS

| | | | | |
|---|---|---|---|---|
| 10,199,312 | B1 * | 2/2019 | Rivera-Marty | H01L 23/49582 |
| 2012/0108013 | A1 * | 5/2012 | Fujisawa | H01L 21/4842 |
| | | | | 438/123 |
| 2014/0035113 | A1 * | 2/2014 | Kierse | H01L 23/49541 |
| | | | | 257/676 |
| 2016/0183369 | A1 * | 6/2016 | Talledo | H01L 21/78 |
| | | | | 361/767 |
| 2016/0190095 | A1 * | 6/2016 | Celaya | H01L 23/49541 |
| | | | | 438/112 |
| 2016/0351477 | A1 * | 12/2016 | Marchisi | H01L 21/4825 |
| 2018/0286789 | A1 * | 10/2018 | Talledo | H01L 23/4952 |
| 2019/0206768 | A1 * | 7/2019 | Shibuya | H01L 23/49541 |
| 2019/0385938 | A1 * | 12/2019 | Shi | H01L 24/48 |

\* cited by examiner

SEMICONDUCTOR CHIP PACKAGE ARRAY

CROSS-REFERENCES TO RELATED APPLICATION

This application claims the priority of Chinese Patent Application No. 201810608530.2, filed on Jun. 13, 2018, the content of which is incorporated herein by reference in its entirety.

TECHNICAL FIELD

The present disclosure generally relates to the field of display technology and, more particularly, relates to a semiconductor chip package method and a semiconductor chip package array.

BACKGROUND

Semiconductor chip package devices have been continuously developed and manufactured toward a direction of high density, high performance, high reliability, and low cost. Correspondingly, a size of the semiconductor chip package devices continuously decreases, and the number of pins on the semiconductor chip package devices continuously increases. A distance between adjacent pins becomes smaller and a density of the pins on the semiconductor chip package devices becomes larger.

However, when soldering the semiconductor chip package devices (e.g., quad flat no-lead package device, square flat leadless package device), a soldering performance is usually undesirable because only a small area of a bottom of the pins on the semiconductor chip package devices is available for soldering tin to climb up to form the pins.

SUMMARY

One aspect of the present disclosure provides a semiconductor chip package array. The array includes a lead frame, chips, an encapsulating layer, and an electroplating layer. The lead frame includes a first surface, a second surface, a plurality of support units arranged in a matrix, first grooves extending from the first surface to the second surface, second grooves extending from the second surface to the first surface, and third grooves extending from the second surface to the first surface. The first grooves are connected to the second grooves to form through holes and the third grooves are connected to adjacent support units of the plurality of support units. The chips are disposed on and electrically connected to the plurality of support units. The encapsulating layer is formed by using an encapsulating material to encapsulate the chips and at least a portion of the plurality of support units, and to fill the first grooves. The electroplating layer is disposed on the second surface of the lead frame, and extends into the third grooves or into the third grooves and the second grooves.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width and depth should be considered during practical fabrication.

Figure 1:
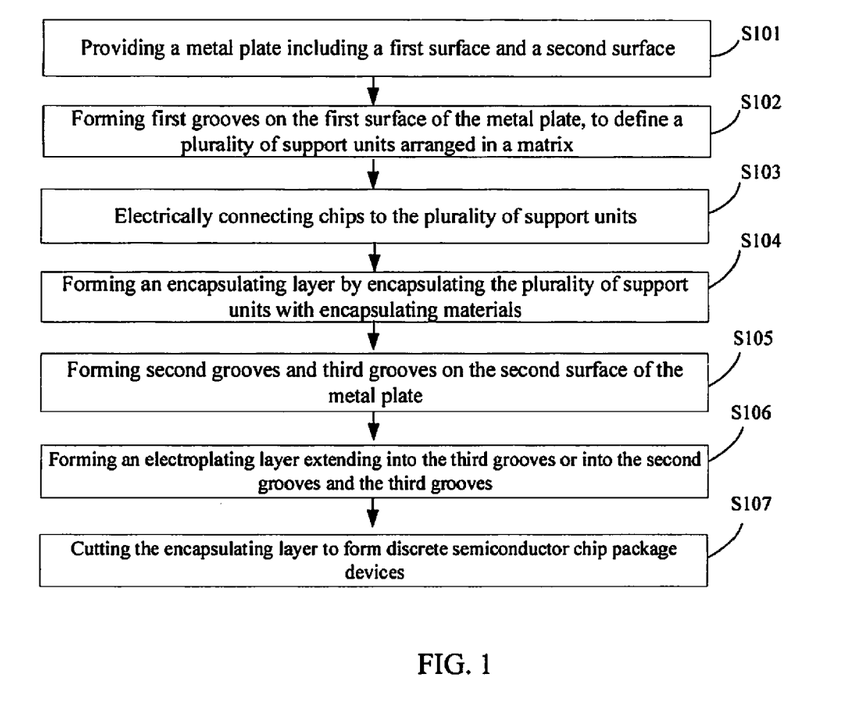
FIG. 1 illustrates an exemplary semiconductor chip package method consistent with various disclosed embodiments in the present disclosure.
Figure 2:
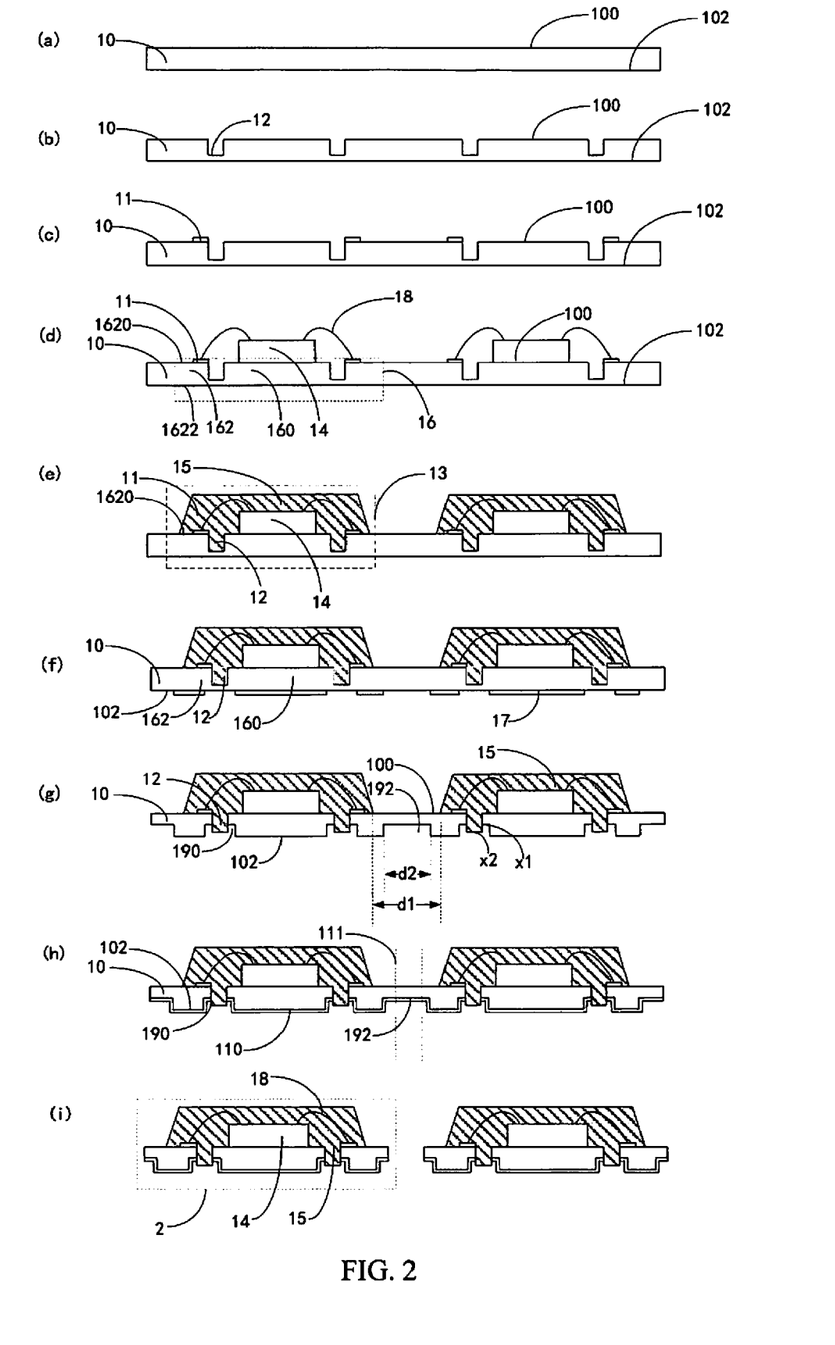
FIG. 2 illustrates structures of an exemplary semiconductor chip package array corresponding to S101-S107 in the semiconductor chip package method in FIG. 1 consistent with various disclosed embodiments in the present disclosure.
Figure 3:
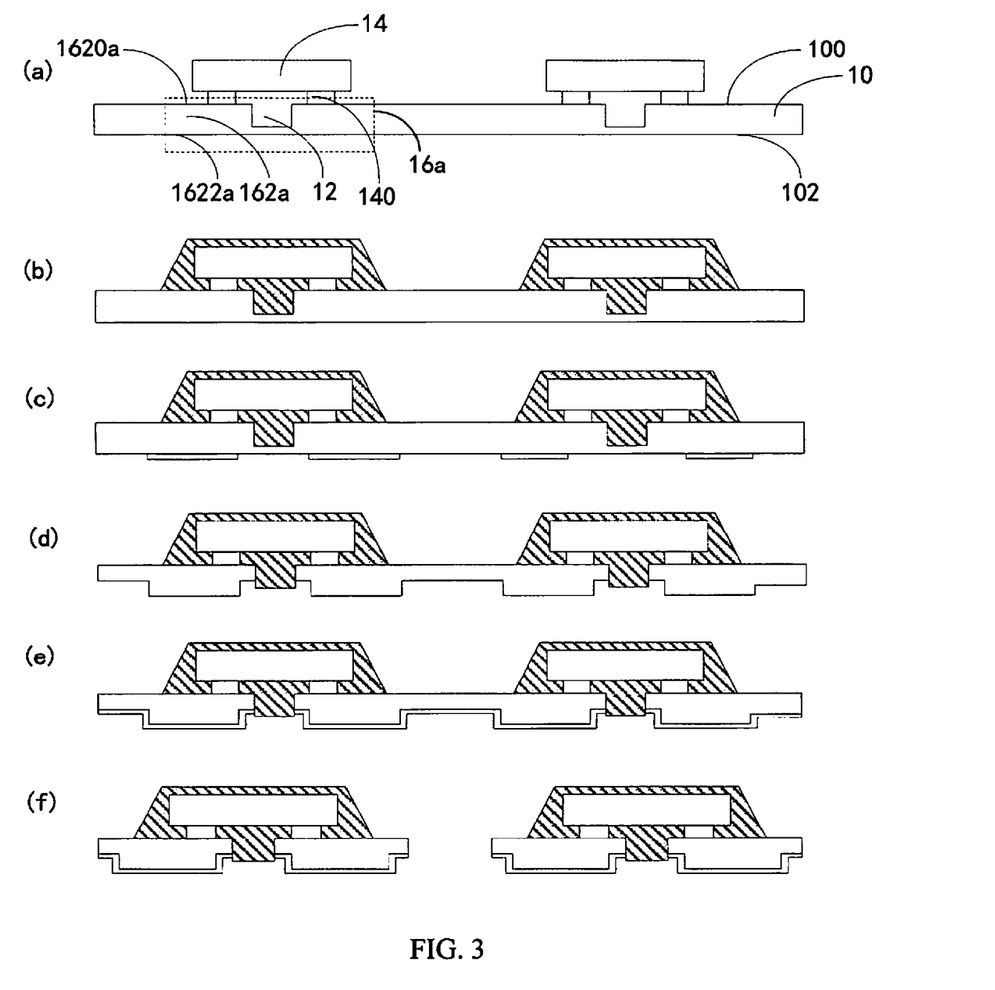
FIG. 3 illustrates structures of another exemplary semiconductor chip package array corresponding to S103-S107 in the semiconductor chip package method in FIG. 1 consistent with various disclosed embodiments in the present disclosure.
Figure 4:
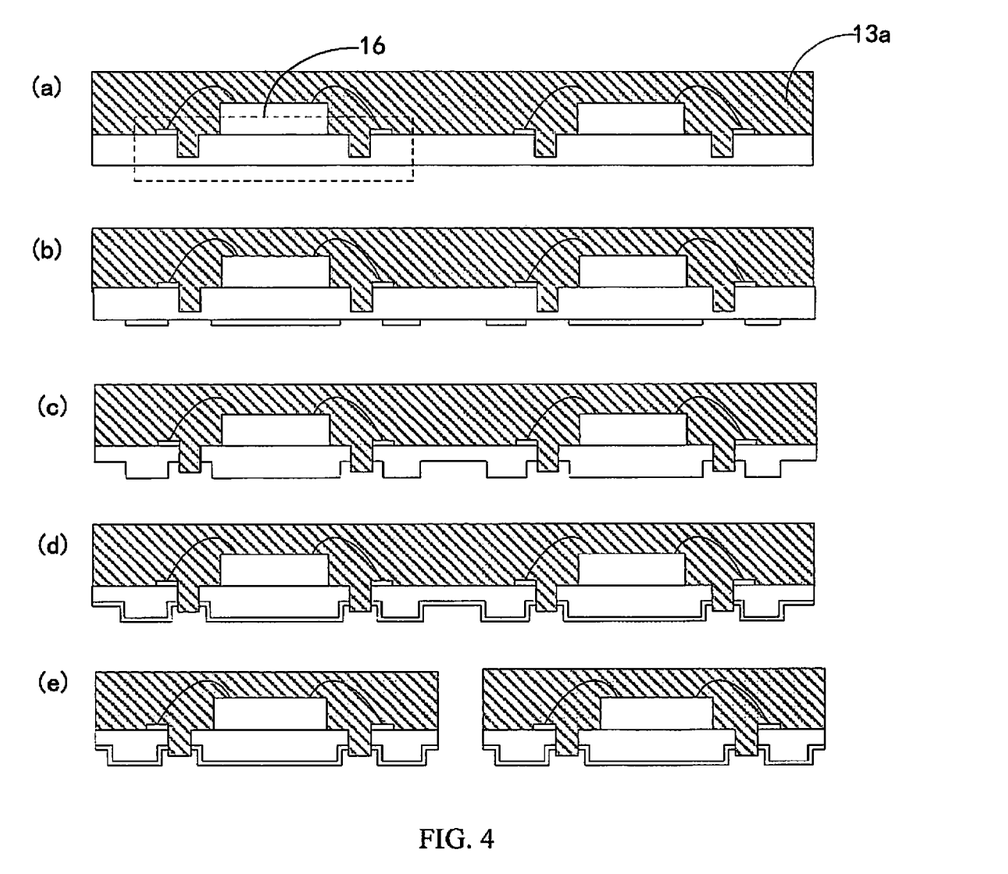
FIG. 4 illustrates structures of another exemplary semiconductor chip package array corresponding to S104-S107 in the semiconductor chip package method in FIG. 1 consistent with various disclosed embodiments in the present disclosure.
Figure 5:
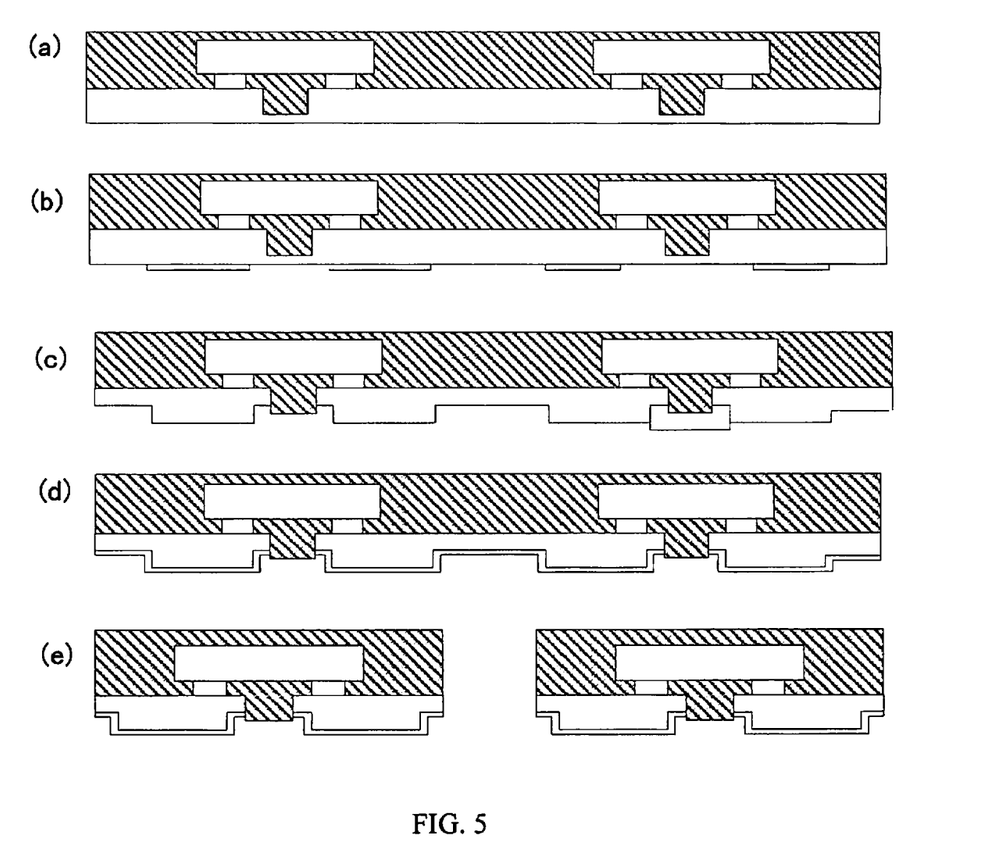
FIG. 5 illustrates structures of another exemplary semiconductor chip package array corresponding to S104-S107 in the semiconductor chip package method in FIG. 1 consistent with various disclosed embodiments in the present disclosure.

FIG. 1 illustrates an exemplary semiconductor chip package method consistent with various disclosed embodiments in the present disclosure. FIG. 2 illustrates an exemplary structure of a semiconductor chip package array corresponding to S101-S107 in the semiconductor chip package method in FIG. 1 consistent with various disclosed embodiments in the present disclosure; FIG. 3 illustrates another exemplary structure of a semiconductor chip package array corresponding to S103-S107 in the semiconductor chip package method in FIG. 1 consistent with various disclosed embodiments in the present disclosure; FIG. 4 illustrates another exemplary structure of a semiconductor chip package array corresponding to S104-S107 in the semiconductor chip package method in FIG. 1 consistent with various disclosed embodiments in the present disclosure; and FIG. 5 illustrates another exemplary structure of a semiconductor chip package array corresponding to S104-S107 in the semiconductor chip package method in FIG. 1 consistent with various disclosed embodiments in the present disclosure.

The method may include:

S101: providing a metal plate including a first surface and a second surface;

S102: forming first grooves on the first surface of the metal plate to efine a plurality of support units arranged in a matrix;

S103: electrically connecting chips to the plurality of support units;

S104: forming encapsulating layers by encapsulating the plurality of support units with plastic encapsulating materials, where the first grooves may be filled with plastic encapsulating materials;

S105: forming second grooves and third grooves on the second surface of the metal plate where the second grooves may be connected to the first grooves to form through holes and the third grooves may be connected to adjacent support units of the plurality of support units;

S106: forming an electroplating layer on the second surface of the metal plate, where the electroplating layer may extend into an inside of the third grooves, or may extend into an inside of the third grooves and an inside of the second grooves; and S107: splitting the encapsulating layers to form independent semiconductor chip package devices.

As illustrated in FIG. 2a, in S101, the metal plate 10 including the first surface 100 and the second surface 102 may be provided. In one embodiment, the metal plate 10 may be made of a material with a good conductivity, a good thermal conductivity and a good mechanical strength including copper, copper alloy, and/or iron-nickel alloy. The metal plate 10 only needs to satisfy the requirements of a lead frame for forming the semiconductor chip package devices.

As illustrated in FIG. 2b, in one embodiment, in S102, the first grooves 12 may be formed on the first surface 100 of the metal plate 10 by a method including an etching method, to form the plurality of support units arranged in a matrix. Each of the plurality of support units may be a minimum unit to support the chips and its range may be determined by whether the chips will be installed normally or reversely. In one embodiment, a side of the metal plate 10 may be etched by half to form the first grooves 12 and then the chips 14 may be encapsulated on the metal plate 10 subsequently. A strength of the lead frame may be improved in comparison with a current method where the chips are encapsulated on a lead frame which is etched through.

In one embodiment, as illustrated in FIG. 2c-FIG. 2d, in S103, the chips 14 may be installed on the plurality of support units 16 normally. Each of the plurality of support units 16 may include a base island 160 separated by the first grooves 12 and a pin 162. For description purposes only, the present disclosure is illustrated by using the embodiment shown in FIG. 2 where each of the plurality of support units 16 includes one pin 162 as an example, and should not limit the scopes of the present disclosure. In various embodiments, each of the plurality of support units 16 may include any suitable number of pins 162. For each of the plurality of support units 16, the pin 162 may include an inner pin 1620 on a side of the first surface 100 of the metal plate 10 and an outer pin 1622 on a side of the second surface 102 of the metal plate 10. S103 may include: installing chips 14 on the base islands 160 of the plurality of support units 16 and electrically connecting the chips 14 to the inner pins 1620 of the plurality of support units 16 by conducting wires 18. In one embodiment, the chips 14 may transmit signals to the pins 162 through the conducting wires 18 or may receive signals from the pins 162 through the conducting wires 18. The conducting wires 18 may be made of a material with a good conductivity, a good mechanical strength, and a good stress relaxation resistance, including gold, aluminum, copper, copper-iron alloy, copper-nickel-silicon alloy, copper-chromium alloy, copper-nickel-tin alloy, and any combinator thereof.

In one embodiment, before electrically connecting the chips 14 to the inner pins 1620 of the plurality of support units 16 by the conducting wires 18, the method may further include forming a metal layer 11 on a surface of each inner pin 1620. The step for electrically connecting the chips 14 to the inner pins 1620 of the plurality of support units 16 by the conducting wires 18 may include electrically connecting the chips 14 to the metal layers 11 of the inner pins 1620 of the plurality of support units 16 by the conducting wires 18. The metal layers 11 may be formed on the inner pins 1620 by a plating method including a partial plating method, a composite plating method, a pulse plating method, an electroforming method, and a mechanical plating method. The metal layers 11 may be made of a material with a good conductivity including nickel, chromium, copper, zinc, and/or cadmium.

In another embodiment illustrated in FIG. 3a, the chips 14 may be installed on the plurality of support units 16 reversely. Each of the plurality of support units 16 may include a pin 162a separated by the first grooves 12. For description purposes only, the present disclosure is illustrated by using the embodiment shown in FIG. 2 where each of the plurality of support units 16 includes one pin 162a as an example, and should not limit the scopes of the present disclosure. In various embodiments, each of the plurality of support units 16 may include any suitable number of pins 162a. For each of the plurality of support units 16, the pin 162a may include an inner pin 1620a on a side of the first surface 100 of the metal plate 10 and an outer pin 1622a on a side of the second surface 102 of the metal plate 10. S103 may include: forming studs 140 on a surface of the chips 14 and electrically connecting the studs 140 to the inner pins 1620a around the first grooves 12.

In one embodiment, in S104, the plastics may be a transparent or a nontransparent material including epoxy resin. When the chips 14 are installed normally, as illustrated in FIG. 2e, S104 may include: forming a plurality of discrete encapsulating parts 13 arranged in a matrix. The plurality of discrete encapsulating parts 13 and the plurality of support units 16 may be arranged in a one-to-one correspondence, and the encapsulating layers 15 between the adjacent discrete encapsulating parts 13 may be not connected. Each encapsulating layer 15 may cover the first grooves 12, the chips 14, and the conducting wires 18 correspondings to the corresponding one of the plurality of support units 16. Each encapsulating layer 15 may further cover an area of the first surface 100 of the metal plate 10 corresponding to the inner pin 1620 in the corresponding one of the plurality of support units 16.

In some other embodiments where the chips 14 are installed normally, as illustrated in FIG. 4a, S104 may include forming one or more discrete encapsulating parts 13a. Each encapsulating part 13a may include a plurality of support units 16 arranged in a matrix.

In some other embodiments where the chips 14 are installed reversely, as illustrated in FIG. 3b and FIG. 5a, the encapsulating method may be similar to the above embodiments where the chips 14 are installed normally.

In one embodiment illustrated in FIGS. 2f-2g, S105 may include: forming a patterned mask 17 on the second surface 102 of the metal plate 10, and etching a portion of the second surface 102 of the metal plate 10 not covered by the patterned mask 17 to form the second grooves 190 and the third grooves 192. The second grooves 190 may be connected to the first grooves 12.

The patterned mask 17 may be formed on the second surface 102 of the metal plate 10 to cover a portion of the second surface 102 of the metal plate 10 which does not need to be etched. A portion of the second surface 102 corresponding to the pins 162 at sides of the first grooves 12 and corresponding to the base islands 160 may be covered by the patterned mask 17. The patterned mask 17 may include openings beneath the first grooves 12. Orthographic projections of the first grooves 12 to the second surface 102 of the metal plate 10 may be in the openings of the patterned mask 17, and edges of the orthographic projections of the first grooves 12 may be not in contact with edges of the openings of the patterned mask 17. A portion of the second surface 102 of the metal plate 10 not covered by the patterned mask 17 may be etched to form the second grooves 190 and the third grooves 192. A portion of the second surface 102 of the metal plate 10 not covered by the patterned mask 17 may be etched further to make a bottom x1 of the second grooves 190 higher than a bottom x2 of the first grooves 12. The second grooves 190 may be connected to the first grooves 12 correspondingly. A projection of each second groove 190 on the first surface 100 may cover a projection of corresponding first groove 12 on the first surface 100. The bottom x2 of each first groove 12 may protrude from corresponding second groove 190, and the encapsulating material 15 in each first groove 12 may protrude from corresponding second groove 190. A protruding portion of the encapsulating material 15 may prevent the pins 162 from being connected to solder materials on the base islands 160 when soldering the formed semiconductor chip package devices. A short circuit may be avoided and the strength of the metal plate 10 may be improved. In some other embodiment, the bottom x1 of the second grooves 190 may be flush with the bottom x2 of the first grooves 12.

In some other embodiments, when the encapsulating parts 13 formed in S104 and the plurality of support units 16 are arranged in a one-to-one correspondence, a distance d1 between any two adjacent encapsulating parts 13 may be larger than a width d2 of the third grooves 192. The distance d1 between any two adjacent encapsulating parts 13 may be a distance between projections of edges of adjacent encapsulating material 15 of two adjacent encapsulating parts 13 on the first surface 100. The width d2 of the third grooves 192 may be a distance between projections of two side edges of the third grooves 192 on the first surface 100. Correspondingly, the pins 192 may be prevented from bending and/or dropping off when cutting and separating the encapsulating parts 13 subsequently.

In some other embodiments, the chips 14 may be installed reversely and the second grooves 190 and the third grooves 192 may be formed similar to the above embodiments where the chips 14 are installed normally, as illustrated in FIGS. 3c-3d, FIGS. 4b-4c, and FIGS. 5b-5c.

As illustrated in FIG. 2h, in S106, the electroplating layer 110 may be formed on the second surface 102 of the metal plate 10 by a method including a plating method. The electroplating layer 110 may be made of a metal including tin, copper, gold, nickel, and/or lead. In one embodiment, the electroplating layer 110 may extend into the second grooves 190 and the third grooves 192. The electroplating layer 110 may only cover sidewalls of the second grooves 190 and sidewalls of the third grooves 192. In some other embodiment, the electroplating layer 110 may further cover a bottom surface of the second grooves 190 and a bottom surface of the third grooves 192. In some other embodiments, the electroplating layer 110 may only extend into one of the second grooves 190 and the third grooves 192.

In some other embodiments, the chips 14 may be installed reversely and the electroplating layer may be formed similar to the above embodiments where the chips 14 are installed normally, as illustrated in FIG. 3e, FIG. 4d, and FIG. 5d.

In one embodiment, S107 may include: cutting the encapsulating layers 15 to form independent semiconductor chip package devices 2. The pins 162 of the independent semiconductor chip package devices 2 may have a T-type vertical cross section along a direction connecting the second grooves 190 and the third grooves 192.

In one embodiment, the encapsulating layers 15 may be separated by a punching method or a cutting method to form independent semiconductor chip package devices 2. Each of the independent semiconductor chip package devices 2 may be a complete chip package unit, and may include a chip 14, an encapsulating layer 15 covering the chip 14, and conducting wires 18 corresponding to the chip 14. The encapsulating layers 15 may be separated along separating lines 111 passing through the metal plate 10. The separating lines 111 may be disposed in corresponding areas of the third grooves 192. In various embodiments, the separating lines 111 may be disposed in central areas of the third grooves 192, or may be disposed away from the central areas. The present disclosure has no limit on the positions of the separating lines 111.

In some other embodiments, when separating the encapsulating layers 15, pads may be disposed beneath the second grooves 190 and the third grooves 192, to prevent bending pins 162 on the metal plate 10. In one embodiment, the pads may completely fill the second grooves 190 and the third grooves 192 on the second surface 102 of the metal plate 10. In other embodiments, the pads may only completely fill the third grooves 102, or only partially support the bottom of the third grooves 192. The present disclosure has no limit on this.

In the present disclosure, in the semiconductor chip package structure formed by the semiconductor chip package method, the outer pins 1622 may further include step elements (regions formed by the second grooves 190 and the third grooves 192) for solder climbing in addition to the conventional region for solder climbing corresponding to the second surface 102. Sides and bottoms of the step elements can be provided for soldering climbing. Correspondingly, an area of the outer pins 1622 for solder climbing may be increased. A soldering performance may be improved and a good production ratio of the semiconductor chip package devices may be increased.

Figure 6:
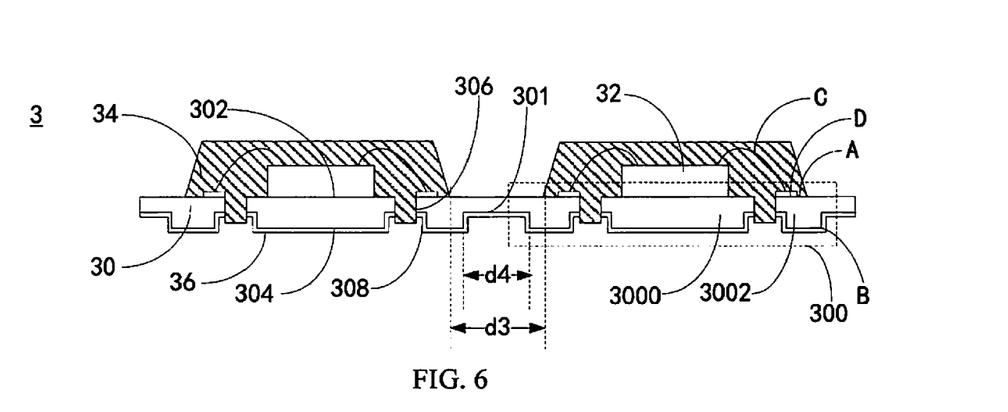
FIG. 6 illustrates an exemplary semiconductor chip package array consistent with various disclosed embodiments in the present disclosure.
Figure 7:
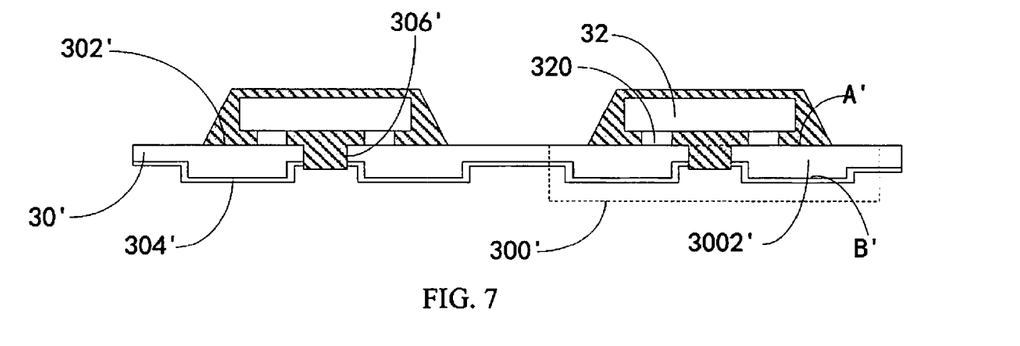
FIG. 7 illustrates another exemplary semiconductor chip package array consistent with various disclosed embodiments in the present disclosure.
Figure 8:
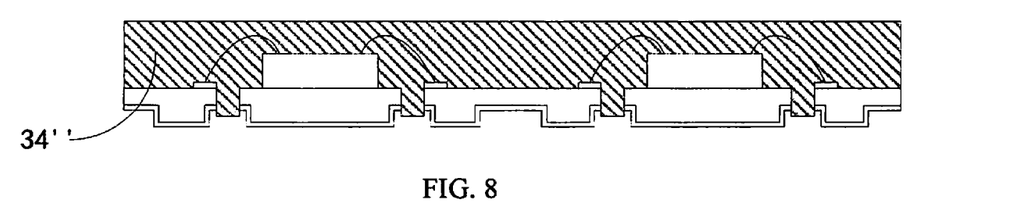
FIG. 8 illustrates another exemplary semiconductor chip package array consistent with various disclosed embodiments in the present disclosure.
Figure 9:
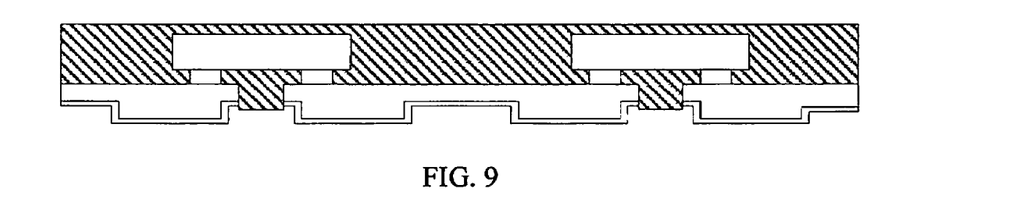
FIG. 9 illustrates another exemplary semiconductor chip package array consistent with various disclosed embodiments in the present disclosure.
Figure 10:
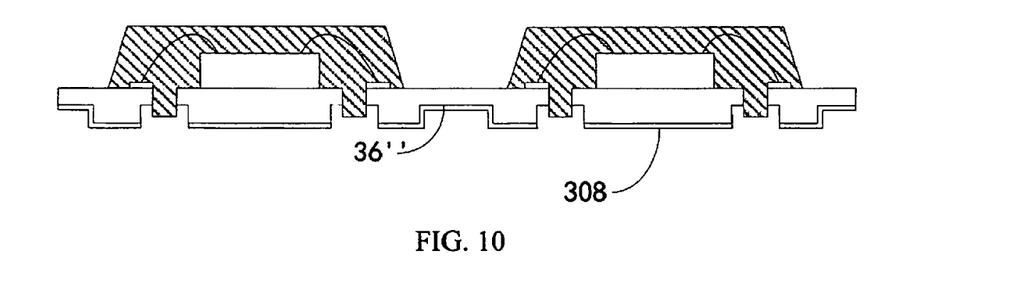
FIG. 10 illustrates another exemplary semiconductor chip package array consistent with various disclosed embodiments in the present disclosure.

Various embodiments of the present disclosure also provided a semiconductor chip package array 3. FIG. 6 illustrates an exemplary semiconductor chip package array consistent with various disclosed embodiments in the present disclosure; FIG. 7 illustrates another exemplary semiconductor chip package array consistent with various disclosed embodiments in the present disclosure; FIG. 8 illustrates another exemplary semiconductor chip package array consistent with various disclosed embodiments in the present disclosure; FIG. 9 illustrates another exemplary semiconductor chip package array consistent with various disclosed embodiments in the present disclosure; FIG. 10 illustrates another exemplary semiconductor chip package array consistent with various disclosed embodiments in the present disclosure.

The semiconductor chip package array 3 may include: a lead frame 30, chips 32, encapsulating layers 34; and a electroplating layer 36.

The lead frame 30 may include: a plurality of support units 300 arranged in a matrix, first grooves 306 extending from a first surface 302 of the lead frame 30 to a second surface 304 of the lead frame 30; second grooves 308 extending from the second surface 304 to the first surface 302; and third grooves 301 extending from the second surface 304 to the first surface 302. The first grooves 306 may be connected to the second grooves 308 to form through holes. The third grooves 301 may be connected to the adjacent support units 300.

The chips 23 may be disposed on the plurality of support units 300, and may be electrically connected to the plurality of support units 300. In one embodiment, the chips 32 may be installed and electrically connected to the plurality of support units 300 normally. Each of the plurality of support units 300 may include a base island 3000 separated by the through holes (or the first grooves 306) and a pin 3002. For each of the plurality of support units 300, the pin 3002 may include an inner pin A on a side of the first surface 302 of the lead frame 30 and an outer pin B on a side of the second first surface 304 of the lead frame 30. The chips 32 may be electrically connected to the inner pins A through conducting wires C. In some embodiments, a metal layer D may be formed on a surface of each inner pin A, and the conducting wires C may electrically connect the chips 32 to the metal layers D. In one embodiment, the pins 3002 may have a T-type vertical cross section along a line connecting the second grooves 308 to the third grooves 301. In some other embodiments, the pins 3002 may have any suitable shape and the present disclosure has no limit on this.

In another embodiment illustrated in FIG. 7, the chips 32 may be installed and electrically connected to a plurality of support units 300' reversely. Each of the plurality of support units 300' may include a pin 3002' separated by the through holes (or the first grooves 306'). For each of the plurality of support units 300', the pin 3002' may include an inner pin A' on a side of the first surface 302' of the lead frame 30' and an outer pin B' on a side of the second first surface 304' of the lead frame 30'. Convex columns 320 may be formed on a surface of the chips 32 and may be electrically connected to the inner pins A' around the through holes.

Each encapsulating layer 34 may encapsulate the corresponding chip 32 and may at least partially encapsulate corresponding one of the plurality of support units 300. The first grooves 306 may be filled with the encapsulating material, to form the encapsulating layers 34. In one embodiment, a projection of each of the second grooves 308 on the first surface 302 may cover a projection of corresponding one of the first grooves 306 on the first surface 302, and the encapsulating layers 34 may fill the first grooves 306 and protrude into the second grooves 308. In some other embodiment, the encapsulating layers 34 may only fill the first grooves 306 and may not protrude into the second grooves 308.

In one embodiment illustrated in FIG. 6, the encapsulating layers 34 may include a plurality of discrete encapsulating parts arranged in a matrix. The plurality of discrete encapsulating parts and the plurality of support units 300 may be arranged in a one-to-one correspondence. A distance d3 between adjacent encapsulating parts may be larger than a width d4 of the third grooves. In another embodiment, the encapsulating layers 34' may include one or more encapsulating parts, and each encapsulating part may cover a portion of the plurality of support units 300 arranged in a matrix.

In some other embodiments, the chips 32 may be installed and electrically connected to a plurality of support units 300 reversely. As illustrated in FIG. 7 and FIG. 9, the encapsulating layers may have a structure similar to the above embodiments.

In one embodiment, the electroplating layer 36 may be disposed on the second surface 304 of the lead frame 30, and may extend into the third grooves 301 and the second grooves 308. The electroplating layer 36 may extend into sides of the third grooves 301, bottoms of the third grooves 301, sides of the second grooves 308 exposed by the encapsulating material, and bottoms of the second grooves 308 exposed by the encapsulating material. In another embodiment, the electroplating layer 36 may only extend into sides of the third grooves 301 and bottoms of the third grooves 301.

Figure 11:
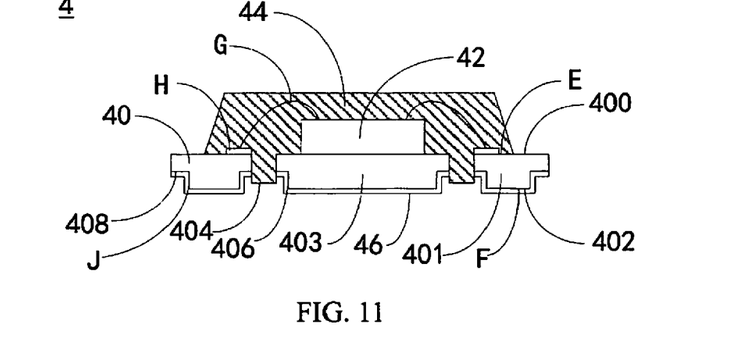
FIG. 11 illustrates an exemplary semiconductor chip package device consistent with various disclosed embodiments in the present disclosure.
Figure 12:
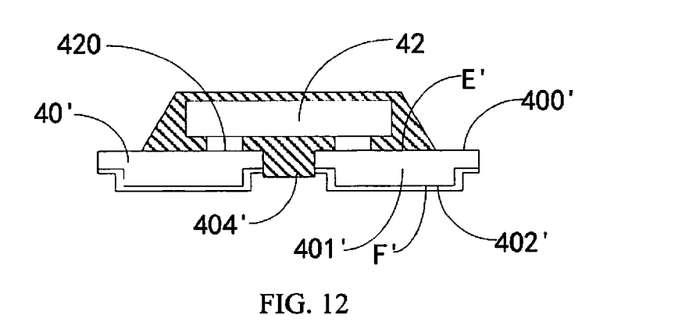
FIG. 12 illustrates another exemplary semiconductor chip package device consistent with various disclosed embodiments in the present disclosure.
Figure 13:
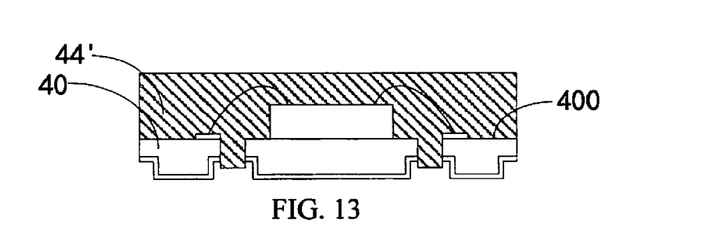
FIG. 13 illustrates another exemplary semiconductor chip package device consistent with various disclosed embodiments in the present disclosure.
Figure 14:
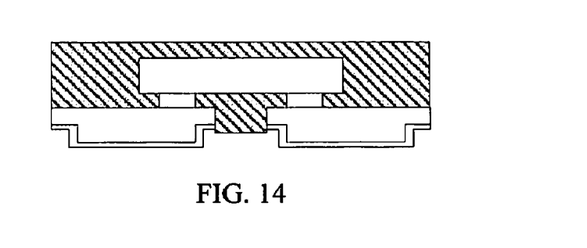
FIG. 14 illustrates another exemplary semiconductor chip package device consistent with various disclosed embodiments in the present disclosure.
Figure 15:
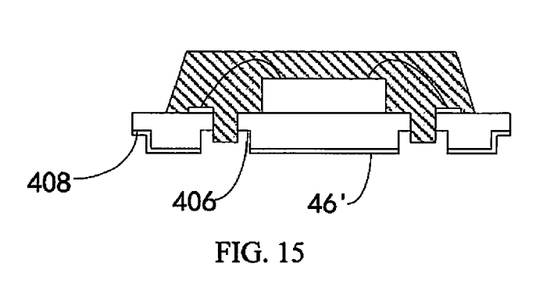
FIG. 15 illustrates another exemplary semiconductor chip package device consistent with various disclosed embodiments in the present disclosure.

The present disclosure also provides a semiconductor chip package device 4. FIG. 11 illustrates an exemplary semiconductor chip package device consistent with various disclosed embodiments in the present disclosure; FIG. 12 illustrates another exemplary semiconductor chip package device consistent with various disclosed embodiments in the present disclosure; FIG. 13 illustrates another exemplary semiconductor chip package device consistent with various disclosed embodiments in the present disclosure; FIG. 14 illustrates another exemplary semiconductor chip package device consistent with various disclosed embodiments in the present disclosure; and FIG. 15 illustrates another exemplary semiconductor chip package device consistent with various disclosed embodiments in the present disclosure.

The semiconductor chip package array 4 may include: a lead frame 40, a chip 42, an encapsulating layer 44; and an electroplating layer 46.

The lead frame 40 may include: first grooves 404 extending from a first surface 400 of the lead frame 40 to a second surface 402 of the lead frame 40; second grooves 406 extending from the second surface 402 to the first surface 400; and third grooves 408 extending from the second surface 402 to the first surface 400. The first grooves 404 may be connected to the second grooves 406 to form through holes. The third grooves 401 may be disposed at edges of the lead frame 40. In one embodiment illustrated in FIG. 11, a projection of each of the second grooves 406 on the first surface 400 may cover a projection of corresponding one of the first grooves 404 on the first surface 400. The projection of each of the second grooves 406 on the first surface 400 may be larger than or equal to the projection of corresponding one of the first grooves 404 on the first surface 400. In another embodiment, the third grooves 408 may form step elements at ends of the lead frame 40, and correspondingly pins 401 of the semiconductor chip package device 4 may have a T-type vertical cross section along a line connecting the second grooves 406 to the third grooves 408. In some other embodiments, the third grooves 408 may form any suitable shapes including slopes at the ends of the lead frame 40, and the present disclosure has no limit on this.

The chip 42 may be electrically connected to the lead frame 40. In one embodiment, the chip 42 may be installed and electrically connected to the lead frame 40 normally. The lead frame 40 may include a base island 403 and pins 401 around the base island 403. The pins 401 may include inner pins E on a side of the first surface 400 of the lead frame 40 and outer pins B on a side of the second first surface 402 of the lead frame 40. The base island 403 and the pins 401 may be separated by the through holes (or the first grooves 404). The chips 42 may be disposed on the base island 403, and be electrically connected to the inner pins E through conducting wires G. In some embodiments, a metal layer H may be formed on a surface of each inner pin E, and the conducting wires G may electrically connect the chip 42 to the metal layers H. In another embodiment illustrated in FIG. 12, the chip 42 may be installed and electrically connected to the lead frame 40' reversely. The lead frame 40 may include pins 401' separated by the through holes (or the first grooves 404). The pins 401' may include inner pins E' on a side of the first surface 400' of the lead frame 40' and outer pins F' on a side of the second first surface 402' of the lead frame 40'. Convex columns 420 may be formed on a surface of the chip 42 and may be electrically connected to the inner pins E' around the through holes.

The encapsulating layer 44 may cover whole or a portion of the first surface 400, and may encapsulate the chip 42. The first grooves 404 may be filled with the encapsulating material, to form the encapsulating layer 44. In one embodiment, the encapsulating layer 44 may fill the first grooves 404 and protrude into the second grooves 406. In some other embodiment, the encapsulating layer 44 may only fill the first grooves 404 and may not protrude into the second grooves 406. In one embodiment illustrated in FIG. 11, the encapsulating layer 44 may cover a portion of the first surface 400 of the lead frame 40, the step elements (the third grooves 408) may include vertical side edges J close to the encapsulating layer 44. The side edges J may be disposed outside a projection of the encapsulating layer 44. In some other embodiments illustrated in FIG. 13, the encapsulating layer 44 may completely cover the first surface 400 of the lead frame 40. The side edges J of the step elements (the third grooves 408) may be disposed in the projection of the encapsulating layer 44. In some other embodiments, the chips 42 may be installed reversely. As illustrated in FIG. 12 and FIG. 14, the encapsulating layer may have a structure similar to the above embodiments.

In one embodiment, the electroplating layer 46 may be disposed on the second surface 402 of the lead frame 40, and may extend into the third grooves 408 and the second grooves 406. The electroplating layer 46 may extend into sides of the third grooves 408, bottoms of the third grooves 408, sides of the second grooves 406 exposed by the encapsulating material, and bottoms of the second grooves 406 exposed by the encapsulating material. In another embodiment, the electroplating layer 46 may only extend into sides of the third grooves 408 and bottoms of the third grooves 408.

In the present disclosure, the semiconductor chip package array may include the second grooves and the third grooves extending from the second surface of the lead frame to the first surface of the lead frame. The electroplating layer may cover the second surface of the lead frame and extend into the third grooves or into the second grooves and the third grooves. Correspondingly, the pins of the semiconductor chip package array may have a structure with the electroplating layer on multiple surfaces. An area for soldering materials to climb may be increased, and a soldering performance may be improved. A good production rate of the semiconductor chip package array may be increased.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments but may be embodied in other equivalent forms without departing from the scope of the present disclosure, which is determined by the appended claims.

What is claimed is:
1. A semiconductor chip package array, comprising:
a lead frame, chips, an encapsulating layer, and an electroplating layer, wherein:
the lead frame includes:
 a first surface,
 a second surface opposite to the first surface,
 a plurality of support units arranged in a matrix,
 first grooves formed in the lead frame from the first surface and having a first thickness less than an entire thickness of the lead frame between the first surface and the second surface, wherein the first grooves are filled with an encapsulating material to form encapsulating material-filled first grooves as a portion of the encapsulation layer,
 second grooves formed in the lead frame from the second surface and having a second thickness less than the entire thickness of the lead frame between the first surface and the second surface, and
 third grooves formed in the lead frame from the second surface in locations different from the second grooves, the third grooves having a third thickness less than the entire thickness of the lead frame between the first surface and the second surface, wherein:
  the first grooves and the second grooves are jointed together from opposite directions to form through holes with the encapsulating material in the first grooves, and the third grooves are connected to adjacent support units of the plurality of support units;

a projection of each of the second grooves on the first surface covers an area larger than a projection of a corresponding one of the first grooves on the first surface; and the encapsulating layer fills the first grooves and protrudes into the second grooves, wherein each portion of the encapsulating layer protruded into a second groove has a sidewall coplanar with a sidewall of a corresponding first groove, and has a bottom surface perpendicular to the sidewall of the corresponding first groove;

the chips are disposed on and electrically connected to the plurality of support units;

the encapsulating layer is formed by using the encapsulating material to encapsulate the chips and the plurality of support units, and to fill the first grooves, wherein the encapsulating layer includes a plurality of discrete encapsulating parts, the plurality of encapsulating parts and the plurality of supporting units are disposed in a one-to-one correspondence, and a distance between adjacent two of the plurality of encapsulating parts is larger than a width of a corresponding third groove located therebetween, the third groove being one of the third grooves formed in the lead frame; and the electroplating layer is disposed on the second surface of the lead frame, and extends into sides and bottoms of the third grooves or into the sides and bottoms of the third grooves and into the second grooves.

2. The array according to claim 1, wherein:
each of the plurality of support units includes a base island separated from pins by the through holes;
the pins include inner pins on a side of the first surface of the lead frame and outer pins on a side of the second surface of the lead frame; and
the chips are electrically connected to the inner pins through conducting wires.

3. The array according to claim 2, wherein:
a metal layer is disposed on a surface of each of the inner pins; and
the conducting wires electrically connect the chips with the metal layers.

4. The array according to claim 2, wherein:
each of the pins has a T-shaped vertical cross section along a connecting line from a second groove to a corresponding third groove.

5. The array according to claim 1, wherein:
each of the plurality of support units includes pins separated by the through holes;
the pins include inner pins on a side of the first surface of the lead frame and outer pins on a side of the second surface of the lead frame;
convex columns are disposed on surfaces of the chips; and
the convex columns are electrically connected to the inner pins around the through holes.

6. The array according to claim 1, wherein:
the electroplating layer extends into sides and bottoms of the second grooves which are uncovered by the encapsulating layer.

7. The array according to claim 1, wherein:
each of the encapsulating parts encapsulates a portion of the plurality of support units arranged in the matrix.

* * * * *